United States Patent [19]

Bergman

[11] 4,305,106
[45] Dec. 8, 1981

[54] SYSTEM FOR SHORT CIRCUIT PROTECTION USING ELECTRONIC LOGIC IN A FEEDBACK ARRANGEMENT

[75] Inventor: James G. Bergman, West Melbourne, Fla.

[73] Assignee: Harris Corporation, Melbourne, Fla.

[21] Appl. No.: 113,430

[22] Filed: Jan. 18, 1980

[51] Int. Cl.³ ............................................. H03K 19/00
[52] U.S. Cl. ............................... 361/1; 361/88; 361/93; 307/200 A; 330/207 P
[58] Field of Search ............................... 361/93, 88, 1; 307/200 A, 269; 330/207 P, 298

[56] References Cited

U.S. PATENT DOCUMENTS

| | | | |
|---|---|---|---|
| 3,749,936 | 7/1973 | Bell | 361/93 |
| 3,979,643 | 9/1976 | Pelc | 330/207 P |
| 3,990,020 | 11/1976 | Porter | 330/207 P |

FOREIGN PATENT DOCUMENTS

| | | | |
|---|---|---|---|
| 55-41019 | 3/1980 | Japan | 307/200 A |
| 55-41020 | 3/1980 | Japan | 307/200 A |

Primary Examiner—J. D. Miller
Assistant Examiner—L. C. Schroeder
Attorney, Agent, or Firm—Leitner, Palan, Martin & Bernstein

[57] ABSTRACT

Electronic logic circuitry operates to detect and correct a short circuit condition, be it a short to system ground or supply voltage, in a circuit output. In one application, the short protection circuitry is incorporated into a high power CMOS driver. If the circuit output is shorted to ground, the short is detected and a signal is fed back to the input. This feedback signal forces the output to ground thus eliminating the excessive current flow. Conversely, if there is a short to supply voltage, $V_{DD}$, a signal is fed back to the input that forces the output to supply voltage $V_{DD}$, again eliminating the excessive current flow.

9 Claims, 5 Drawing Figures

FIG. 1
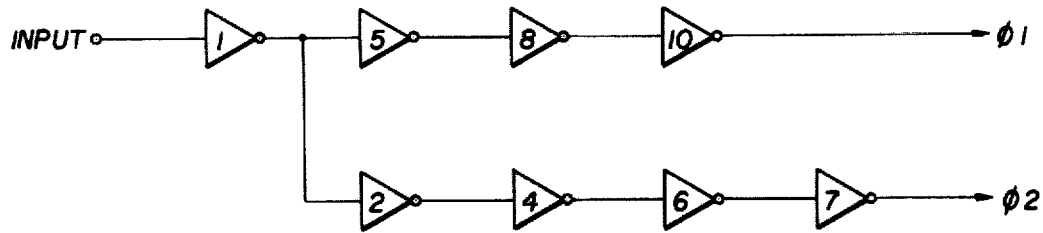
FIG. 2
FIG. 5
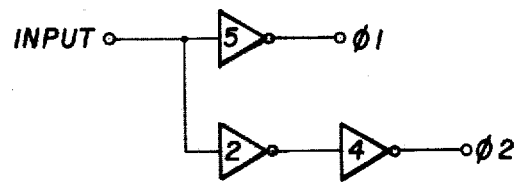
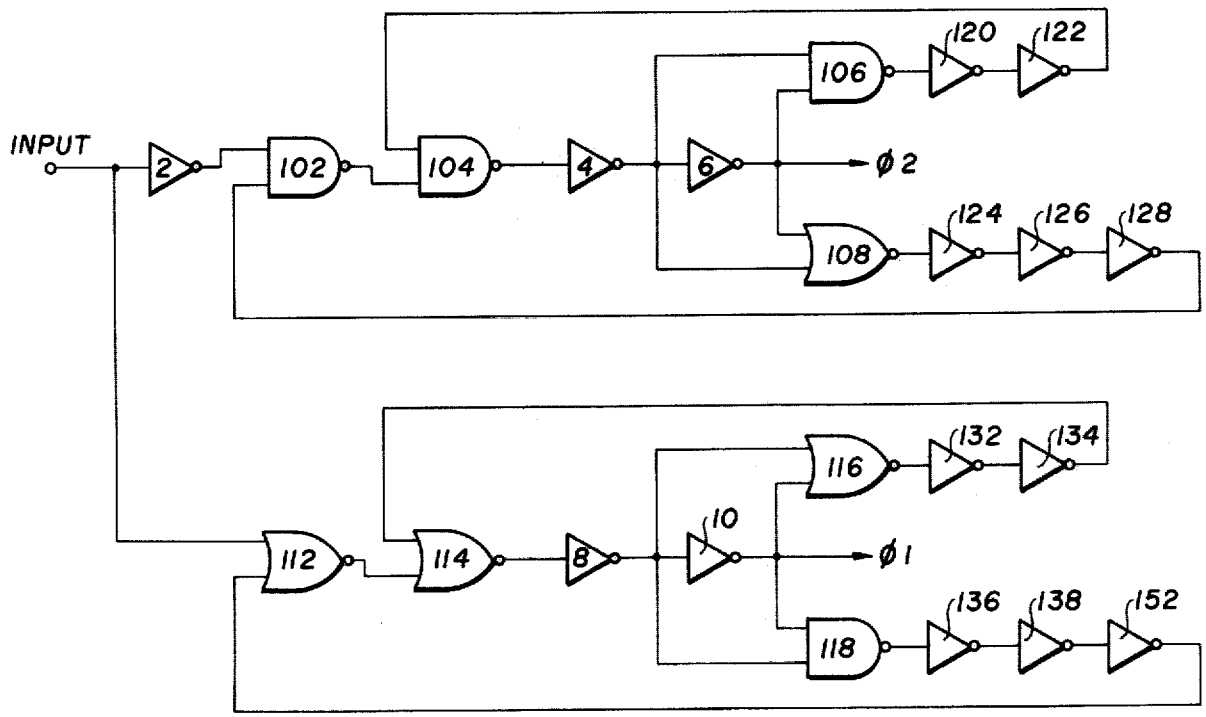

SYSTEM FOR SHORT CIRCUIT PROTECTION USING ELECTRONIC LOGIC IN A FEEDBACK ARRANGEMENT

BACKGROUND OF THE INVENTION

In electronic circuits such as semiconductor driver circuits, there exists the possibility that the output can be shorted to a circuit reference potential, such as ground. It is also possible for the output to be shorted to the circuit supply potential hereinafter referred to as $V_{DD}$. By a short circuit condition it is meant that the output becomes connected, through a very low impedance path, to either ground or circuit supply, $V_{DD}$, irrespective of the input signal.

When uncontrolled, short circuit condition can result in component burnout due to excessive current flow over the short circuit path between the component and the shorting potential, be it ground or supply potential. As explained in U.S. Pat. No. 3,749,936 to Bell, which describes an output protection circuit of the prior art, semiconductor devices have finite breakdown voltages and current limitations. As such, while a semiconductor device can withstand short periods of high current or longer periods of lower current, if these limitations are exceeded the device will be over stressed and may become permanently inoperable.

While semiconductor circuits are designed to control current to the semiconductor device to within safe limits, circuit malfunctions may result in short circuiting the output with attendant long periods of high current. To protect against this occurrence it is known to provide semiconductor circuits with added fault protection circuitry. The Bell patent describes such a fault protection circuit in the form of a clock signal dependent, feedback loop.

The Bell feedback loop functions to prevent burnout of either of the circuit's output transistors, the circuit output being taken at a point between these two transistors. One output transistor connects the circuit supply to the output node, while the second transistor connects the output node to circuit ground. Under normal operation, only one of these two output transistors would be conductive at any moment. When the output is signaled to assume ground potential, the transistor between the supply source and the output node is off while the transistor between the output and ground is rendered conductive. On the other hand, when the output is signaled to assume the potential of the supply, the transistor between the output and ground is turned off and the transistor between the supply, $V_{DD}$, and the output terminal is turned on.

Considering the first case mentioned, when the output is signaled to assume ground potential, if the output becomes shorted to supply potential, $V_{DD}$, in the presence of a signal ordering the output to assume ground potential thus turning on the transistor between the output and ground, a potential drop appears across this conducting transistor equal to the full value of the potential difference between supply and ground. High current flows, being much greater than that for which the circuit was designed and component burnout is likely.

In the latter mentioned case, in the presence of an output shorted to ground, the conducting transistor between the output and the supply bears the entire supply to ground potential drop and excessive current once again flows.

The Bell protection circuit operates to command the input to assume that state required to produce an output state corresponding to the shorted condition. For example, if the output were shorted to ground, the feedback loop, in response to clock signals, commands the input to assume a state which in normal circuit operation would cause the output to assume the ground state. The short to ground then becomes a harmless fault since this circuit is in the output to ground state and the components are in such states as to be compatible with a grounded output condition. Therefore, component damage is prevented.

In an identical manner, with the output shorted to supply potential the feedbck loop, in response to clock signals, commands the input to assume a state which forces the output to assume $V_{DD}$. Thus, the short to supply becomes a harmless fault since the circuit is in the output to supply state and the components are in such state as to be compatible with an output at supply potential.

The Bell device is clock signal dependent. That is, it will only work if the clock is running. Since it is clock signal dependent, the circuit response to alleviate a short is necessarily slow. This is so for when a short is removed the output will remain in the opposite state until the next clock pulse. A short circuit protection apparatus which is clock independent would indeed be advantageous.

SUMMARY OF THE INVENTION

An object of the invention is to provide short circuit protection using clock independent electronic logic to detect and correct a short circuit condition.

A further object of the invention is to provide a short protection circuit wherein logic circuitry feeds back the detected short circuit condition to cause the input to match the output, thereby eliminating the short circuit condition.

Another object is to provide such a short protection circuit which is capable of eliminating a short to either ground or supply voltage.

These and other objects, as will become apparent from a reading of this specification, are realized by supplementing a semiconductor circuit with logic circuits operating to detect a fault condition and for producing a correction signal which when fed back to the circuit input causes the input to assume a state, which in normal operation would cause the output to assume a state corresponding to the short condition. Three embodiments of the invention are discussed, each in relation to a two phase clock driver providing two outputs $\phi 1$ and $\phi 2$.

In a first embodiment of the invention, short protection circuits for a two phase clock driver provide protection of each of the two outputs $\phi 1$ and $\phi 2$ from shorts to both ground and supply potential. To protect against a short to supply potential, a feedback path with a coincident gate is provided at each output. To protect against a short to ground, a second feedback path at each of the outputs is provided with an alternative gate. In the embodiment illustrated, the coincidence gate is a NAND gate and the alternative gate is a NOR gate. From the $\phi 2$ output, both the coincidence and alternative gate feedback circuits terminate at coincidence gate input logic. The feedback circuits for the $\phi 1$ output terminate in alternative gate input logic.

In second and third embodiments of the invention, a two phase clock driver is provided with protection against a short circuit to supply potential and protection against a short circuit to ground potential, respectively.

BRIEF DESCRIPTION OF THE DRAWINGS

FIG. 1 is an illustration of a conventional two phase clock driver without short circuit protection.

FIG. 2 depicts a short protection circuit according to the teachings of the present invention as applied to a two phase clock driver, the protection circuitry providing protection against a short to either ground or supply potential.

FIG. 5 illustrates another prior art two phase clock driver without short circuit protection.

DETAILED DESCRIPTION OF THE PREFERRED EMBODIMENTS

Figure 3:
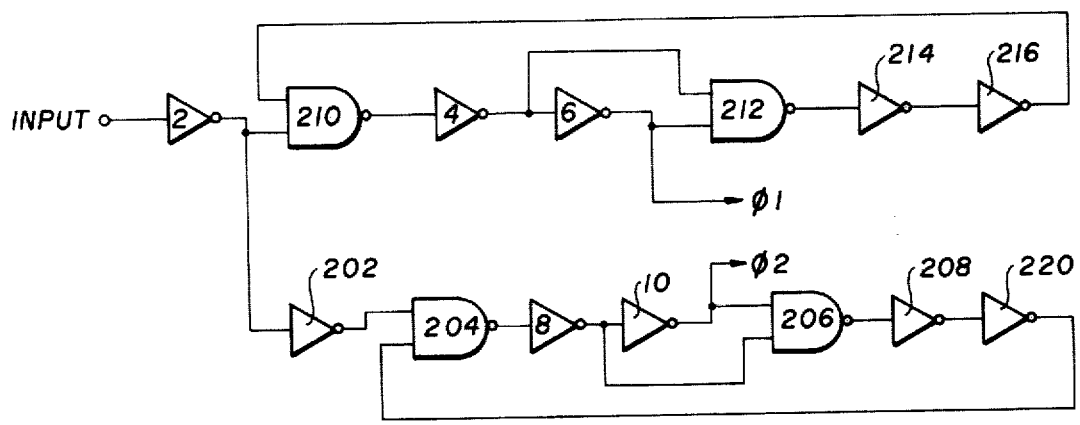
FIG. 3 is an illustration of a short protection circuit in accordance with the teachings of the present invention as applied to a two phase clock driver, protection being provided against a short to supply potential only.

FIG. 1 illustrates a conventional two phase clock driver without short circuit protection. The clock driver is comprised of two sets of serially connected inverters. An input signal which, is in the form of either a logic high corresponding to supply potential, $V_{DD}$, or a logic low, corresponding to ground potential, appears at the input and is supplied to either the $\phi 1$ circuit branch or the $\phi 2$ circuit branch through inverter 1. The $\phi 1$ branch is comprised of inverters 5, 8 and 10. The $\phi 2$ circuit branch is comprised of inverters 2, 4, 6 and 7. The conventional two phase clock driver (FIG. 1) without short circuit protection could be built as shown in FIG. 5. The additional inverters (8, 10, 6, 7) are used to provide additional signal amplification and phase correction to reduce the skew between $\phi 1$ and $\phi 2$. This allows a relatively weak input signal to be amplified to drive a relatively large output load on $\phi 1$ and $\phi 2$.

Such two phase clock drivers, which have application in Sequential Digital CMOS Circuits are often manufactured in CMOS integrated circuit technology. In high power CMOS driver circuits there exists the possibility that the output could accidently be shorted to ground or to the supply potential. Should this condition occur, there will be excessive self heating and added power dissipation in the system. If this condition is not detected and corrected, permanent electrical damage may occur. The electronic logic circuitry of the present invention functions as a short circuit detection and correction means to eliminate excessive current flow should a short circuit condition occur. The elimination of excessive current prevents excessive heating and power dissipation.

Referring first to the inventive embodiment of FIG. 2, short protection for a two phase clock driver is realized using electronic logic circuitry which supplements the conventional driver circuit. The added logic circuitry of FIG. 2 protects both the $\phi 1$ and $\phi 2$ outputs from both a short to ground and a short to supply potential.

Consider first a short of the $\phi 1$ output to supply, $V_{DD}$. Such a short is detected by the NAND circuit 118 enabled by the logic high which corresponds to the $V_{DD}$ potential at the $\phi 1$ output. The NAND circuit 118 forms a part of the coincident gate feedback circuit which also includes inverters 136, 138 and 152. The logic high at the $\phi 1$ output disables the alternative gate feedback circuit, which includes NOR gate 116 and inverters 120, 122, commanding an input to a first control NOR gate 114 to a logic low whereby this gate is enabled. Assuming a short to $V_{DD}$ condition, an input signal commanding the $\phi 1$ output to ground, corresponding to a logic low, will fail to force $\phi 1$ to a logic low but will cause the input to inverter 10 to assume a logic high state. As a result, both inputs to NAND gate 118 are at a logic high causing its output to assume a logic low condition. This effects a logic low output from the gate 112 causing the gate 114 output to assume a logic high which appears at the output of the inverter 8 as a logic low. This logic low causes the output of the inverter 10 to assume the logic high condition which corresponds to the short to $V_{DD}$ thereby eliminating excessive current flow under short conditions.

A short to the supply potential at the $\phi 2$ output is detected by the NAND gate 106. In the presence of such a short, an input signal commanding the $\phi 2$ output to a logic low will cause the input to inverter 6 to assume a logic high while this inverter's output remains at a logic high. The output of NAND gate 106 goes to a logic low which causes the output of NAND gate 104 to assume a logic high state. This state is inverted by inverter 4 forcing the inverter 6 output to a state, $V_{DD}$, corresponding to the short condition.

The circuitry of FIG. 2 also operates to prevent circuit damage in the event of a short to ground at either output $\phi 1$ or $\phi 2$. Consider first the shortening of $\phi 1$ to ground. An input signal ordering the $\phi 1$ output to assume $V_{DD}$ causes the input to inverter 10 to attain a logic low condition while its output remains at logic low. This results in a logic low at the two inputs to NOR gate 116, with a logic high at its output. This logic high appears as a logic high at one input to control NOR gate 114 forcing its output to a logic low. The inverter 8 inverts this logic low to present a logic high to the input of inverter 10. The circuit is now in the proper state for $\phi 1$ output at ground, eliminating the excessive current flow caused by the short.

Consider next a short to ground at the $\phi 2$ output. Such a condition would disable the NAND circuit 106 forcing its output to a logic high. The logic low at the $\phi 2$ output enables the NOR circuit 108. Should the input signal command the output to a logic high while the $\phi 2$ output is in the short to ground condition, a logic low appears at the output of inverter 4. Thus, a logic low appears at both inputs to NOR gate 108 producing a logic high at its output.

Through the operation of inverters 124, 126 and 128, a logic low appears at an input to NAND circuit 102. The logic low condition at an input to NAND circuit 102 causes a logic high at its output. Gate 104 has be enabled through the operation of NAND gate 106 and inverters 120, 122 responsive to the logic low at the $\phi 2$ output. Therefore, the logic high at the output of NAND gate 102 causes a logic low to appear at the input of inverter 4. Inverter 4 inverts this logic condition to produce a logic high at the input to the inverter 6. This places the circuit in a proper state for a logic low output.

The circuit FIG. 2 may be more fully understood by considering its operation during normal conditions. Under normal operating conditions, the short protection circuitry is not activated and does not interfere with normal driver performance. Consider first a logic high command at the input to the circuit of FIG. 2, with the $\phi1$ output initially at ground. With $\phi1$ at ground NAND gate 118 is disabled which, through the operation of inverters 136, 138 and 152, causes a logic low at one input to the NOR gate 112 thereby enabling this gate. When enabled, gate 112 operates as an inverter inverting the input signal at the circuit input. With the circuit operating normally, the output of the inverter 8 is at a logic high when the output of the inverter 10 is at a logic low. This causes a logic low to appear at the output of NOR circuit 116 enabling the control NOR gate 114. Thus, a logic high input signal is first inverted by gate 112 and again inverted by the gate 114 to appear as a logic high at the input to the inverter 8. As a result, a logic low appears at the input to the inverter 10, which logic low causes the $\phi1$ output to assume a logic high which corresponds to the input signal.

When the $\phi1$ output assumes a logic high condition, NOR gate 116 is disabled producing a logic low at its output. This logic low appears as a logic low input to NOR circuit 114 by reason of the operation of inverters 133 and 134. The output from NAND gate 118 is a logic high which appears as a logic low at one input to NOR circuit 112 through the operation of circuits 136, 138 and 152. Thus, the gating circuits 112 and 114 are once again enabled and operate as inverters. On the occurrence of a logic low input signal, the output of the gate 112 goes to a logic high with the output of the gate 114 then assuming a logic low. The logic low is inverted by the inverter 8 to apply a logic high to the input of the inverter 10 forcing the $\phi1$ output to ground or logic low condition in accordance with the input command.

Normal operation of the $\phi2$ branch of the driver circuit is similar to that described with respect to $\phi1$ branch operations. Briefly, with the $\phi2$ output at ground potential, the input to the inverter 6 is at a logic high. The output from NAND circuit 106 is thus at a logic high. This logic high passes through inverters 120 and 122 to enable the NAND circuit 104. The output of the NOR circuit 108 is at a logic low. This logic low passes through the inverters 124, 126 and 128 to enable the NAND circuit 102. A logic high input command maintains the $\phi2$ output at a logic low while providing a logic high output at $\phi1$. More specifically, a logic high at the circuit input is inverted by inverter 2 and appears as a logic low at the input to inverter 4. This signal is inverted by the inverter 4 and then inverter 6 to maintain the output at a logic low.

A logic low input propagates through the $\phi2$ circuit causing the $\phi2$ outputs to assume a logic high state. The operation is briefly as follows. The logic low input is inverted by the inverter 2 causing the output of NAND circuit 102 to assume a logic low. This logic low appears as a logic high at the output of inverter 4. This logic high is once again inverted by inverter 6 to produce a logic high at the $\phi2$ output.

The operation of the circuit of FIG. 2 in the presence of a short to ground at both the $\phi1$ and $\phi2$ outputs will now be explained in detail. Looking first to the $\phi1$ output, it is assumed that as a result of normal circuit operation the $\phi1$ output is at a logic low or ground. At this point in time, one input to each of gates 116 and 118 is at a logic low while the other input to each gate is at a logic high. A logic high input signal operates through the $\phi1$ branch of the driver circuit to produce at the output of inverter 8 a logic low signal which, with normal circuit operation, is inverted by the inverter 10 to produce a logic high at the $\phi1$ output. However, under the short to ground condition, both the input and the output of the inverter 10 remain at a logic low condition in the presence of a logic low input signal. This logic low condition is propagated through NOR gate 116, inverter 132 and inverter 134 to the input of NOR circuit 114 to disable the gate 114. More specifically, the output of the NAND gate 116 in the presence of a logic low at both of its inputs is a logic high. This signal produces a logic high at one input to NOR gate 114, disabling this gate to produce a logic low at its output irrespective of the signal at its other input. The logic low is inverted by the inverter 8 to produce a logic high at the input to inverter 10 to produce a condition in the $\phi1$ circuit corresponding to a logic low output. The output is thus commanded to assume the short circuit state.

Operation of the $\phi2$ branch of the cicuit in response to a short to ground will now be considered in detail. It is assumed that the $\phi2$ output has initially been placed in the ground condition as a result of normal circuit operation. Therefore, the input to the inverter 6 is at a logic high. As previously discussed, the NAND circuit 106 output thereby assumes a logic high enabling the NAND gate 104. The inputs to the NOR gate 108 are such as to force the input of this gate to a logic low. A logic low input signal under normal circuit operation has the effect of producing a logic low at the output of the inverter 4 and a logic high state at the output of the inverter 6. However, with the output of the inverter 6 shorted to ground potential, a logic low condition appears at both the input and output of the inverter 6. The logic low signals at both the input and output of inverter 6 produce a logic high at the output of NOR circuit 108. This logic high propagates through inverters 124, 126 and 128 to the input to the NAND circuit 102 to disable this circuit. The output of the circuit 102 thus becomes a logic high which appears as a logic low at the output of the gate 104 which remains enabled. The logic low is inverted by the inverter 4 to appear as a logic high causing the output of the inverter 6 to assume the logic low or ground condition notwithstanding the fact that the input signal to the $\phi2$ circuit is a logic low which under normal operation would command the $\phi2$ output to assume a logic high state. This again eliminates the short circuit current flow.

The details of the circuit operation in response to the short to supply voltage $V_{DD}$, at both the $\phi1$ and $\phi2$ outputs will now be explained. With the $\phi1$ output at the logic high or $V_{DD}$ state as a result of normal circuit operation, the input to the inverter 10 is at a logic low. As a result, the NOR circuit 116 output is at a logic low. This logic low appears as one input to NOR gate 114 thus enabling this gate. The inputs to the gate 118 are a logic high and a logic low, producing a logic high output. This causes a logic low at one input to the gate 112 to enable this gate. Under normal circuit operation, a logic low input signal should produce a logic low at the $\phi1$ output. However, should the $\phi1$ output be shorted to supply, then the output remains at a logic high while the input to the inverter 10 assumes a logic high. A logic high is realized at the input to the inver;ter 10 through the operation of NOR gates 112 and 114 operating as inverters in response to a logic low input signal. The logical high input to inverter 10 does not produce any change at the output of the NOR circuit 116 and thus the circuit 114 remains enabled. However, the output of the NAND gate 118 changes state to a logic low. This disables NOR gate 112 to produce a logic low at its output. This logic low appears as a logic high at the output of the gate 114 producing a logic low at the input to the inverter 10. The output of the inverter 10 is thus forced to a logic high which corresponds to the short circuit condition, thereby eliminating excessive current flow.

A short to logic high at the $\phi 2$ output triggers the protection circuitry into operation in the following manner. As will be recalled, under normal operation, with the $\phi 2$ output at a logic high, the input inverter 6 is at a logic low. The NOR gate 108 ouput is at a logic low. This logic low propagates to the input of the NAND gate 102 as a logic high to enable that gate. The input to NAND gate 104 is also enabled. A logic high input signal under normal circuit operations will force the $\phi 2$ output to a logic low. However, with the $\phi 2$ output shorted to a logic high, the logic high input produces a logic high at the input to the inverter 6 while the $\phi 2$ output remains at a logic high. This new condition has no effect on the output of the NOR circuit 108 and thus the NAND circuit 102 remains enabled. However, the output of the NAND circuit 106 assumes a logic low state which disables the NAND circuit 104 producing a logic high at its output. This logic high is inverted by the inverter 4 to produce a logic low at the input to the inverter 6 notwithstanding a logic high input signal at the circuit input. This logic low is inverted by the inverter 6 to produce a logic high at the $\phi 2$ output corresponding to the short circuit condition.

A feature of the present invention involves the design and construction of the inverter and the feedback circuits of the short protection circuitry. The feedback circuitry is designed to rapidly respond to a shorted condition but to present a considerable delay before the input signal is enabled to allow normal circuit operation. With circuitry fabricated with CMOS technology, the difference in response time is achieved by varying the size of the P-Channel and the N-Channel in the feedback converters. By varying the ratio of the width of the P-Channel device to the width of the N-Channel device one can vary the ratio of propagation delay high to low to the propagation delay low to high. The drive capability of MOS device is directly proportional to the width of the transistor; by reducing the drive capability, the switching time and propagation delay are increased.

Consider for example the inverters 120 and 122. By ratioing the width of the P-Channel device with the width of the N-Channel device, one can control the ratio of the propagation delay high to low to the propagation delay low to high. Inverters 120 and 122 are designed to respond slowly to the transition from a logic low to a logic high of the gate 106. In this way, once the protection circuitry has responded to a shorted condition on the $\phi 2$ output, it will be slow in enabling the input signal to the NAND gate 104.

Assume for the moment that the input is a logic high which forces $\phi 2$ to a logic low condition. Now assume that there is a continuous short to supply on $\phi 2$. As explained earlier, gate 106 will detect the short and force gate 104 output to a logic high. This will result in the input to gate 6 to be at a logic low and the output to be at a logic high. When this occurs gate 106 now no longer detects a short condition. This is detected and fed back to gate 104 which then allows the normal input to again force the output of gate 6 to a logic low. The short is then again detected and the whole process repeats itself. If the ratio of the time that the output of gate 122 is a logic high to the time that its output is a logic low is approximately 50%, then the output of gate 6 will be enable low 50% of the time. This means that the amount of current and the amount of power dissipated due to the short to supply on the output of gate 6 has been reduced approximately 50%. A further reduction in power dissipation can be achived by modifying the propagation delay high to low relative to the propagation delay low to high. The longer the output of gate 122 stays low the longer gate 6 output is forced high and less power is dissipated due to the short to supply.

The inverters 120 and 122 also serve a second function. They prevent false triggering of the protection circuitry. During transition when the input of the inverter 6 is going from a logic low to a logic high, the output changes from a logic high to a logic low. During the transition both the input and the output of the inverter 6 could be at a logic high through a period of time equal to the propagation delay of the inverter 6. Since the propagation delays of the NAND gate 106 and the inverters 120 and 122 are much longer than the propagation delay of the inverter 6, the protection circuitry will not respond to the output changing state. A similar analysis applies to the NOR gate 108 and inverters 124, 126 and 128 as well as the gates in the feedback loops associated with the $\phi 1$ output.

FIG. 3 illustrates a simplified version of the circuitry of FIG. 2. The circuitry of FIG. 3 may be used where concern for a short to ground does not exist. In the protection scheme of FIG. 3, the $\phi 1$ and $\phi 2$ outputs of a two phase clock driver are protected against a short to supply voltage only. The oeration of the circuitry is substantially similar to that of the circuitry of FIG. 2 relative to protection against a short to supply. Therefore, a detailed description of its operation is believed unnecessary for full and complete understanding of the instant invention. Briefly, however, it should be appreciated that under normal operation, a logic high input will produce a logic high output at $\phi 1$ and a logic low output at $\phi 2$. With a logic high at the $\phi 1$ output a logic low appears at the input to the inverter 6 which causes a logic high at the output of the NAND circuit 212. This results in the enabling of NAND circuit 210. With the circuit operating properly, the logic low to the input would produce a logic high at the input to the inverter 6 and a logic low at the $\phi 1$ output. However, with the circuit shorted to a logic high, the logic low input products a logic high at the input to the inverter 6 while the output of the inverter 6 is maintained at a logic high. The output of NAND circuit 212 changes to a logic low producing a logic high at the output of the NAND circuit 210. This logic high is inverted by the inverter 4 to produce a logic low at the input to inverter 6 and a logic high at its output to match the short condition.

Considering the $\phi 2$ circuit, under normal operation, the output of the NAND circuit 206 is high enabling the NAND gate 204. A logic high input to this circuit, during proper operation would produce a logic low at the $\phi 2$ output. However, with the $\phi 2$ output shorted to a logic high, the logic high input will produce a logic high to the input of inverter 10 while there is maintained a logic high at the inverter output. This abnormal condition produces a change in the output of the gate 206 causing the output to assume a logic low which produces at the output of the gate 204 a logic high. This logic high is inverted by the inverter 8 to produce a logic low at the input to the inverter 10 and a logic high at the inverter 10 output matching the short condition.

Figure 4:
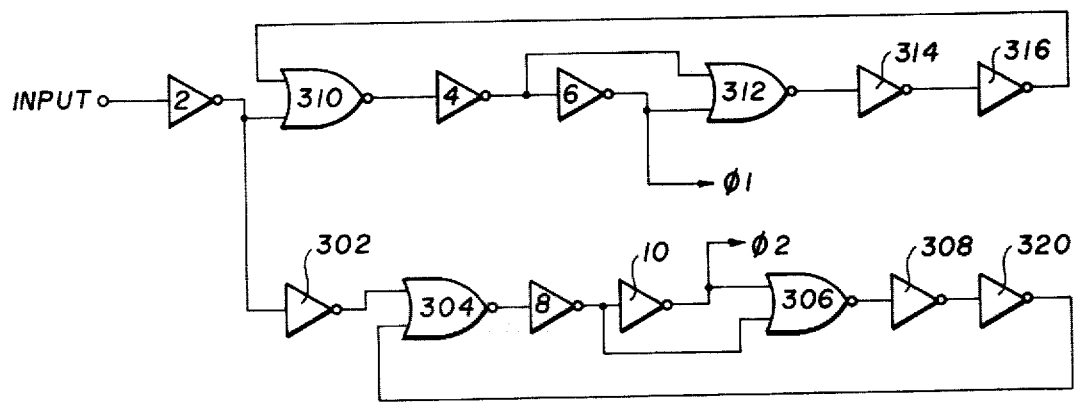
FIG. 4 is a further embodiment of the instant invention as applied to a two phase clock driver, with protection being provided against a short to ground only.

The circuit of FIG. 4 is another simplified version of the FIG. 2 short protection circuit. It is useful when applied to circuitry where a short to supply voltage condition is not concern. The circuitry of FIG. 4 operates to protect the two phase clock driver from a short to ground condition.

Briefly, a logic low input will produce a logic low output at $\phi 1$ and a logic high output at $\phi 2$. The logic low condition at $\phi 1$ produces a logic high at the input to the inverter 6. This produces a low condition at one input to the NOR gate 310. When the input signal changes to a logic high, during normal circuit operation, the input to the inverter 6 assumes a logic low and the output of the inverter 6 assumes a logic high. However, under the short to ground circumstance, the output of the inverter 6 remains at a logic low while the input to the inverter 6 assumes a logic low state. As a result the output of the NOR circuit 312 goes to a logic high. A logic high thus appears at one input to the gate 310 which is seen at its output as a logic low. This logic low is inverted by the inverter 4 to produce a logic high at the input of the inverter 6. As a result, the inverter 6 output assumes the state coincident with the short circuit condition.

Consider next the $\phi 2$ output of FIG. 4 shorted to ground in the presence of a logic low signal at the input. The lgoi low input signal is inverted by the inverter 2 and again inverted by the inverter 302 to produce at its output a logic low signal. Two logic low signals thus appear at the two inputs of the NOR gate 304 to produce a logic high at its output. This logic high is inverted by the inverter 8 to produce a logic low at the input to the inverter 10. Since the output of the inverter 10 is shorted to ground, that is logic low, both inputs to the NOR circuit 306 are at logic lows. The output of the circuit 306 thus assumes a logic high which is inverted by the inverter 308 and again by the inverter 320 to produce a logic high at the input to the NOR circuit 304. This produces a logic low at the output of the NOR circuit 304 which is inverted by the inverter 8. The input to the inverter 10 is then at a proper state to compensate for a short to ground.

There has been described in detail, electronic logic, clock independent, short protection circuiting for electronic circuitry and particularly for a two phase clock driver. The electronic logic circuitry, which may be CMOS devices, is in the form of a feedback circuit which protects and corrects for a short to ground or a short to supply condition. When a short condition does not exist, the short protection circuit is not activated and does not interfere with the normal driver performance. In one embodiment of the invention herein described, a two phase CMOS driver is protected from a possible short to supply, $V_{DD}$, as well as to ground. Either or both outputs can be shorted to $V_{DD}$ or ground and the short circuit protection circuitry will prevent permanent electrical damage. In a second embodiment of the invention, a two phase driver is protected against the short to supply. In another design the output circuitry is protected against a short to ground. These latter designs are for restricted applications.

I claim:

1. In an electronic circuit, an output of which may be inadvertently shorted to a circuit reference potential, a short protection circuit for detecting and correcting the short condition, the improvement comprising;

feedback circuit means responsive only to said output being shorted to a first circuit reference potential and an input command signal commanding said output to assume a second circuit reference potential for commanding said output to assume the said first reference potential irrespective of the input command signal.

2. In a short protection circuit as claimed in claim 1, further including first and second feedback circuit means, each comprised of logic elements each of said feedback circuit means being responsive only to said output being shorted to a circuit reference potential different from that to which an input signal commands the output to assume, the first and second feedback circuit means being responsive to the output being shorted to a first circuit reference potential, the second of said first and second feedback circuit means being responsive to the output being shorted to a second circuit reference potential.

3. In a short protection circuit as claimed in claim 2, wherein said first circuit reference potential is the circuit supply potential and said second circuit reference potential is circuit ground potential.

4. In a a short protection circuit as claimed in claim 3, wherein said electronic circuit to be protected is a two phase clock driver comprised of first and second circuit branches producing complementary outputs, there being a feedback circuit means comprised of logic elements connected to each of the two circuit outputs to detect a short condition in either of said outputs.

5. In a short protection circuit as claimed in claim 4, wherein there is provided first and second feedback circuit means for each of said circuit branches for detecting and correcting in each circuit branch a short to either circuit supply potential or circuit ground potential.

6. In a short protection circuit as claimed in claim 5, wherein said circuit means for detecting and correcting a short to circuit supply potential comprises coincidence gate means.

7. In a short protection circuit as claimed in claim 5, wherein said feedback circuit means for detecting and correcting a short to circuit ground comprises alternative gate means.

8. In a short protection circuit as claimed in claims 6 or 7, wherein said first branch circuit includes first and second alternative gate means receiving, respectively, as one input thereto the feedback signal from said feedback circuit for detecting and correcting a short to ground condition and the feedback signal from said feedback circuit for detecting and correcting a short to supply condition.

9. In a short protection circuit as claimed in claim 8 wherein said second branch circuit includes first and second coincidence gate means receiving, respectively, as one input thereto the feedback signal from said feedback circuit for detecting and correcting a short to circuit ground condition and the feedback signal from said feedback circuit for detecting and correcting a short to supply condition.

* * * * *